United States Patent
Xing et al.

(10) Patent No.: US 9,202,841 B1
(45) Date of Patent: Dec. 1, 2015

(54) METHOD OF FABRICATING SEMICONDUCTOR STRUCTURE

(71) Applicant: OmniVision Technologies (Shanghai) Co., Ltd., Shanghai (CN)

(72) Inventors: Jiaming Xing, Shanghai (CN); Jing Ye, Shanghai (CN); Xifeng Gao, Shanghai (CN); Zhetian Shi, Shanghai (CN)

(73) Assignee: OMNIVISION TECHNOLOGIES (SHANGHAI) CO., LTD., Shanghai (CN)

( * ) Notice: Subject to any disclaimer, the term of this patent is extended or adjusted under 35 U.S.C. 154(b) by 0 days.

(21) Appl. No.: 14/490,645

(22) Filed: Sep. 18, 2014

(30) Foreign Application Priority Data

Jun. 3, 2014 (CN) .......................... 2014 1 0243358

(51) Int. Cl.
   *H01L 27/146*   (2006.01)
   *H01L 21/768*   (2006.01)
   *H01L 21/28*    (2006.01)
   *H01L 23/48*    (2006.01)
   *H01L 23/00*    (2006.01)

(52) U.S. Cl.
   CPC .... *H01L 27/14643* (2013.01); *H01L 27/14625* (2013.01); *H01L 21/28132* (2013.01); *H01L 21/76877* (2013.01); *H01L 23/481* (2013.01); *H01L 24/83* (2013.01)

(58) Field of Classification Search
   CPC ................... H01L 27/14643; H01L 27/14689; H01L 21/76802; H01L 21/76877; H01L 23/481; H01L 27/14625; H01L 27/14634; H01L 21/02074; H01L 21/28132; H01L 21/67121; H01L 24/32; H01L 24/83; H01L 27/1464
   See application file for complete search history.

(56) References Cited

U.S. PATENT DOCUMENTS

2013/0134576 A1*   5/2013   Hayashi ..................... 257/734

\* cited by examiner

*Primary Examiner* — Yasser A Abdelaziez
*Assistant Examiner* — Farun Lu
(74) *Attorney, Agent, or Firm* — Blakely Sokoloff Taylor & Zafman LLP (57) ABSTRACT

A method of fabricating a semiconductor structure is disclosed, in which a pad above a connecting section and metal structures above a functional section are formed from the same metal layer. This design enables the simultaneous formation of the pad and the metal structures by forming a single metal layer and performing thereon a selective etching process, thereby leading to the advantages of process simplification, throughput improvement and cost reduction.

15 Claims, 7 Drawing Sheets

METHOD OF FABRICATING SEMICONDUCTOR STRUCTURE

CROSS-REFERENCES TO RELATED APPLICATIONS

This application claims the priority of Chinese patent application number 201410243358.7, filed on Jun. 3, 2014, the entire contents of which are incorporated herein by reference.

TECHNICAL FIELD

The present invention relates generally to semiconductor device fabrication, and in particular, to a method of fabricating a semiconductor structure.

BACKGROUND

With the development of multimedia technology, digital still cameras, digital video cameras and mobile phones with camera functions have gained increasing popularity among consumers. In addition to their pursuit for the miniaturization of these devices, customers are also demanding for an increasing improvement in the quality (i.e., clarity) of images captured by such devices. On the other hand, whether such a device could capture a high imaging quality heavily depends on what components the device incorporates. In particular, the imaging quality of a camera is determined by an incorporated imaging sensor, which is a critical component of the camera.

Nowadays, most image sensors are implemented as complementary metal-oxide-semiconductor (CMOS) circuits. In a typical CMOS sensor, each pixel generally includes a photodiode and other circuitry components, arranged in a sensor layer overlying a substrate. The sensor layer is usually covered by one or more dielectric layers selectively laminated with several metal interconnect layers which incorporate additional circuitry components and are intended to form interconnect structures. The CMOS sensor further includes a pad for electrically interconnecting the circuitry components. In general terms, the side of the CMOS sensor where the dielectric layers and associated interconnect structures are formed is referred to as a front side, while the opposite side of the substrate is referred as a backside.

For a front side-illuminated (FSI) CMOS sensor, light from an illuminated scene is incident on its front side when the sensor is used, while backside-illuminated (BSI) CMOS sensors are those with their backsides receiving the light from the scene when in use. Any CMOS sensor, no matter it is an FSI or BSI one, should be equipped with optical filters to deal with the light from the illuminated scene before the light enters corresponding photodiodes.

In a conventional CMOS sensor, in order to prevent the occurrence of optical cross-talk between adjacent optical filters, light-blocking layers are further arranged therebetween. However, as the light-blocking layers and the pad are conventionally formed in different processes using different techniques, the sensor fabrication process is associated with high complexity and cost and suffers from a low throughput. Another deficiency of the conventional CMOS sensor is that a protection layer for the pad, which causes reduction of light absorption, intervenes between the optical filters and the photodiodes.

SUMMARY OF THE INVENTION

It is therefore an objective of the present invention to provide a method of fabricating a semiconductor structure, which is capable of simplifying semiconductor device fabrication processes (e.g., fabrication processes of CMOS sensors), improving production throughput, reducing production cost, and enhancing light absorption efficiency.

The foregoing objective of the invention is attained by a method of fabricating a semiconductor structure that includes the steps of: providing a substrate defining a connecting section and a functional section, wherein the substrate includes a connecting layer in the connecting section; forming a protective insulating layer over the substrate, the protecting insulating layer covering both the connecting and functional sections; etching the protective insulating layer and the substrate to form at least one first opening, each of the at least one first opening exposing the connecting layer; lining a sidewall of each of the at least one first opening with a sidewall insulating layer; filling a conductive material into each of the at least one first opening to form a conductive structure; forming a metal layer over the protective insulating layer, the metal layer covering both the connecting and functional sections; and performing a selective etching process on the metal layer to form a pad above the connecting section and a metal structure above the functional section, such that the pad is located on the conductive structure and is connected to the connecting layer via the conductive structure.

Optionally, the protective insulating layer may include a high-k dielectric insulating layer and an oxide layer stacked on the high-k dielectric insulating layer.

Optionally, the high-k dielectric insulating layer may have a thickness of 5 nm to 100 nm, and the oxide layer may have a thickness of 10 nm to 200 nm.

Optionally, the method may further include forming a first conductive layer over the protective insulating layer after forming the conductive structure and prior to forming the metal layer, the first conductive layer covering the conductive structure.

Optionally, the first conductive layer may be formed of thallium nitride or titanium nitride layer.

Optionally, the first conductive layer may have a thickness of 5 nm to 100 nm.

Optionally, the method may further include forming a second conductive layer over the protective insulating layer, after forming the conductive structure and prior to forming the metal layer.

Optionally, the second conductive layer may be formed of thallium nitride or titanium nitride layer.

Optionally, the second conductive layer may have a thickness of 5 nm to 50 nm.

Optionally, the method may further include forming a protective layer over the substrate, the protective layer covering both the pad and the metal structure.

Optionally, the protective layer may be a silicon oxide layer.

Optionally, the method may further include forming a second opening in the protective layer, the second opening exposing at least a portion of a top surface of the pad.

Optionally, the method may further include forming a third opening in the protective insulating layer after forming the conductive structure and prior to forming the metal layer, the third opening exposing a portion of the substrate. Additionally, a grounding structure may be formed in the substrate during the selective etching process performed on the metal layer, the grounding structure having at least a portion situated in the third opening.

Optionally, the semiconductor structure may be a CMOS sensor, and the metal structure may include at least one light-blocking layer of the CMOS sensor.

As described above, the method of the present invention provides the following advantages over the conventional methods.

Firstly, as the pad is connected to the connecting layer by the conductive structure and the pad and the metal structure are formed from the same metal layer, the advantages of process simplification, throughput improvement and cost reduction can be achieved by simultaneously fabricating the pad and the metal structure through forming a single metal layer and performing thereon a selective etching process.

Secondly, the only element disposed between the metal structure and the substrate is the protective insulating layer, which is particular beneficial for the applications where the metal structure is implemented as one or more light-blocking layers for optical filters disposed between the light-blocking layers, because this makes the protective insulating layer the only element disposed between the optical filters and the substrate and thus enables paths between the optical filters and corresponding photodiodes to be only intervened by the protective insulating layer but no protective layer for the pad, thereby enhancing light absorption efficiency of the CMOS sensor.

DETAILED DESCRIPTION

The semiconductor structure and the method of fabricating the structure, of the present invention, will be described in greater detail in the following description which demonstrates preferred embodiments of the invention, in conjunction with the accompanying drawings. Those of skill in the art should, in light of the present disclosure, appreciate that many changes can be made in the specific embodiments disclosed herein and still obtain the same beneficial results. Therefore, the following description should be construed as the illustrative of the principles of the present invention, and not providing limitations thereto.

For simplicity and clarity of illustration, not all features of the specific embodiments are described. Additionally, descriptions and details of well-known functions and structures are omitted to avoid unnecessarily obscuring the invention. The development of any specific embodiment of the present invention includes specific decisions made to achieve the developer's specific goals, such as compliance with system related and business related constraints, which will vary from one implementation to another. Moreover, such a development effort might be complex and time consuming but would nevertheless be a routine undertaking for those of ordinary skill in the art.

The present invention will be further described in the following paragraphs by way of example with reference to the accompanying drawings. Features and advantages of the invention will be apparent from the following detailed description, and from the appended claims. Note that the accompanying drawings are provided in a very simplified form not necessarily presented to scale, with the only intention of facilitating convenience and clarity in explanation.

A principal concept of the present invention is to provide a semiconductor structure, which includes: a substrate defining a connecting section and a functional section, the substrate including a connecting layer in the connecting section; a protective insulating layer on one side of the substrate, the protecting insulating layer covering both the connecting and functional sections; at least one first opening on the one side of the substrate, each of the at least one first opening exposing the connecting layer, each of the at least one first opening having a side wall lined with a sidewall insulating layer, each of the at least one first opening being filled with a conductive structure formed of a conductive material; a pad on the side of the protective insulating layer, opposite the substrate, the pad being situated above the connecting section, the pad covering the conductive structure such that it is connected to connecting layer thereby; and a metal structure on the side of the protective insulating layer, opposite the substrate, the metal structure being situated above the functional section. The pad and the metal structure may be fabricated from the same metal layer, which can lead to the advantages of process simplification, throughput improvement and cost reduction through fabricating a single metal layer and performing thereon a single selective etching process.

In accordance with the principal concept of the invention, a method of fabricating a semiconductor structure, is also provided, which includes the steps of:

S11) providing a substrate defining a connecting section and a functional section, wherein the substrate includes a connecting layer in the connecting section;

S12) forming a protective insulating layer over the substrate, the protecting insulating layer covering both the connecting and functional sections;

S13) etching the protective insulating layer and the substrate to form at least one first opening, each of the at least one first opening exposing the connecting layer;

S14) lining a sidewall of each of the at least one first opening with a sidewall insulating layer;

S15) filling a conductive material into each of the at least one first opening to form a conductive structure;

S16) forming a metal layer over the protective insulating layer, the metal layer covering both the connecting and functional sections; and S17) performing a selective etching process on the metal layer to form a pad above the connecting section and a metal structure above the functional section, such that the pad is located on the conductive structure and is connected to the connecting layer via the conductive structure.

The present invention will become more apparent from the detailed description of several possible embodiments set forth below. It is to be understood that this invention is not limited to these embodiments, and modifications made thereto by those of ordinary skill in the art based on common technical means are also considered to be within the scope of the invention.

Figure 1:
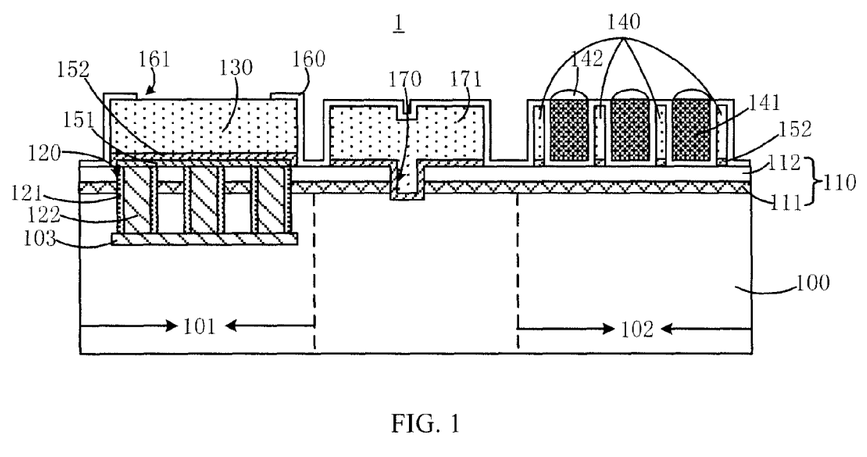
FIG. 1 is a schematic illustration of a semiconductor structure in accordance with one embodiment of the present invention.

Reference is first made to FIG. 1, which schematically illustrates a semiconductor structure 1 in accordance with one embodiment of the present invention. As illustrated, the semiconductor structure 1 includes a substrate 100, a protective insulating layer 110, a conductive structure 122, a pad 130 and a metal structure 140. The substrate 100 defines a connecting section 101 and a functional section 102, and the substrate 100 includes a connecting layer 103 in the connecting section 101 for connecting the pad 130. In this embodiment, the semiconductor structure 1 is implemented as a CMOS sensor, in which the functional section 102 is for forming pixels. Note that while not shown in FIG. 1, those skilled in the art will appreciate that the functional section 102 may further include a substrate, photodiodes and other circuitry components. Moreover, it should be appreciated that it is within the scope of the present invention that the connecting layer 103 is alternatively implemented as any metal interconnect layer of an interconnect structure in the substrate 100, which is configured according to practical needs and is electrically connected to the pad 130 to allow circuitry components in the substrate 100 to be supplied with power.

The protective insulating layer 110 is over the substrate 100. Preferably, the protective insulating layer 110 is comprised of a high-k dielectric insulating layer 111 and an oxide layer 112, which are stacked together in such a manner that the oxide layer 112 is located on the high-k dielectric insulating layer 111. The high-k dielectric insulating layer 111 may have a permittivity that is higher than or equal to 4, such as, for example, 5, 8, 10 or higher, in order to impart better electrical performance to the semiconductor structure 1. Preferably, the high-k dielectric insulating layer 111 has a thickness of 5 nm to 100 nm, such as, for example, 10 nm, 20 nm, 30 nm, 40 nm, 50 nm, or 80 nm. Preferably, the oxide layer 112 has a thickness of 10 nm to 200 nm, such as, for example, 20 nm, 50 nm, 80 nm or 150 nm. The oxide layer 112 may be fabricated from silicon oxide, silicon oxynitride or the like, in order to have good protective and insulating characteristics. While the semiconductor structure 1 has been illustrated as a BSI CMOS sensor in which the protective insulating layer 110 is formed on the backside of the substrate 100, in other embodiments, it may also be implemented as an FSI CMOS sensor in which the protective insulating layer 110 is formed on the front side of the substrate 100.

Preferably, the semiconductor structure 1 further includes a first conductive layer 151 intermediate the pad 130 and the protective insulating layer 110 and over the conductive structure 122, which can facilitate the adhesion between the pad 130 and the protective insulating layer 110. Preferably, the first conductive layer 151 is fabricated from thallium nitride, titanium nitride or the like, such that desirable adhesion can be insured both between the first conductive layer 151 and the pad 130 and between the first conductive layer 151 and the protective insulating layer 110. Preferably, the first conductive layer 151 has a thickness of 5 nm to 100 nm, such as, for example, 10 nm, 20 nm, 30 nm, 40 nm, 50 nm, or 80 nm.

In this embodiment, the semiconductor structure 1 further includes a second conductive layer 152, which is formed between the pad 130 and the protective insulating layer 110 and between the metal structure 140 and the protective insulating layer 110 to increase the adhesion between the pad 130 and the protective insulating layer 110 and the adhesion between the metal structure 140 and the protective insulating layer 110. Preferably, the second conductive layer 152 is fabricated from thallium nitride or titanium nitride, which are materials each having desirable adhesiveness. Preferably, the second conductive layer 152 has a thickness of 5 nm to 50 nm, such as, for example, 10 nm, 20 nm, 30 nm, or 40 nm. While it has been illustrated in FIG. 1 that the first conductive layer 151 is formed between the protective insulating layer 110 and the second conductive layer 152, the present invention is not limited in this regard as other implementations are also possible in which the second conductive layer 152 is formed between the first conductive layer 151 and the protective insulating layer 110. This can be appreciated by those skilled in the art, and thus will not be further described herein.

In addition, at least one first opening 120 is formed in the substrate 100, wherein each of the at least one first opening 120 may extend downward from a top surface of the protective insulating layer 110 through the entire thickness of the protective insulating layer 110 to a certain depth in the substrate such that a bottom of each first opening 120 exposes the underlying connecting layer 103. Each of the at least one first opening 120 has an inner sidewall lined with a sidewall insulating layer 121 and is filled with a conductive material to form a conductive structure 122. The number of the at least one first opening 120 may be one, two, three, four or more. The sidewall insulating layer 121 is configured to space the corresponding conductive structure 122 from the substrate 100 so as to electrically insulate them.

The pad 130 is above the connecting section 101, on the side of the protective insulating layer 110 opposite the substrate 100. The pad 130 covers the conductive structure 122, namely the conductive material filled in each of the at least one first opening 120, so as to connect the connecting layer 103 to other circuitry components.

The metal structure 140 is above the functional section 102 and also on the side of the protective insulating layer 110 opposite the substrate 100. In this embodiment, the semiconductor structure 1 is implemented as a CMOS sensor, and the metal structure 140 includes at least one light-blocking layer for optical filters of the CMOS sensor. In this embodiment, four light-blocking layers are shown in FIG. 1, however the number of light-blocking layers can be adjusted according to practical needs. In addition, an optical filter 141 may be arranged between every two adjacent light-blocking layers and provided with a lens 142 thereon, such that light from an illuminated scene will sequentially pass through the lens 142 and the optical filter 141 before it enters the corresponding photodiode.

The semiconductor structure 1 may further include a protective layer 160 above the substrate 100. The protective layer 160 may cover both the pad 130 and the metal structure 140 to protect them. Preferably, the protective layer 160 is formed of silicon oxide or another suitable oxide. Further, a second opening 161 may be formed in the protective layer 160 to expose a portion of the pad 130.

Preferably, the semiconductor structure 1 may further include other functional components, such as, for example, a grounding structure 171. As shown in FIG. 1, a third opening 170 exposing a portion of the substrate 100 may be formed in the protective insulating layer 110, and the grounding structure 171 may be accommodated within the third opening 170 so as to ground the substrate 100. The grounding structure 171 may be formed in any section of the semiconductor structure 1, for example, the connecting section 101, the functional section 102, or another section other than the above two. In addition, the grounding structure 171 may be covered by the protective layer 160, with the second conductive layer 152 intermediate the protective insulating layer 110 and the grounding structure 171.

Figure 2:
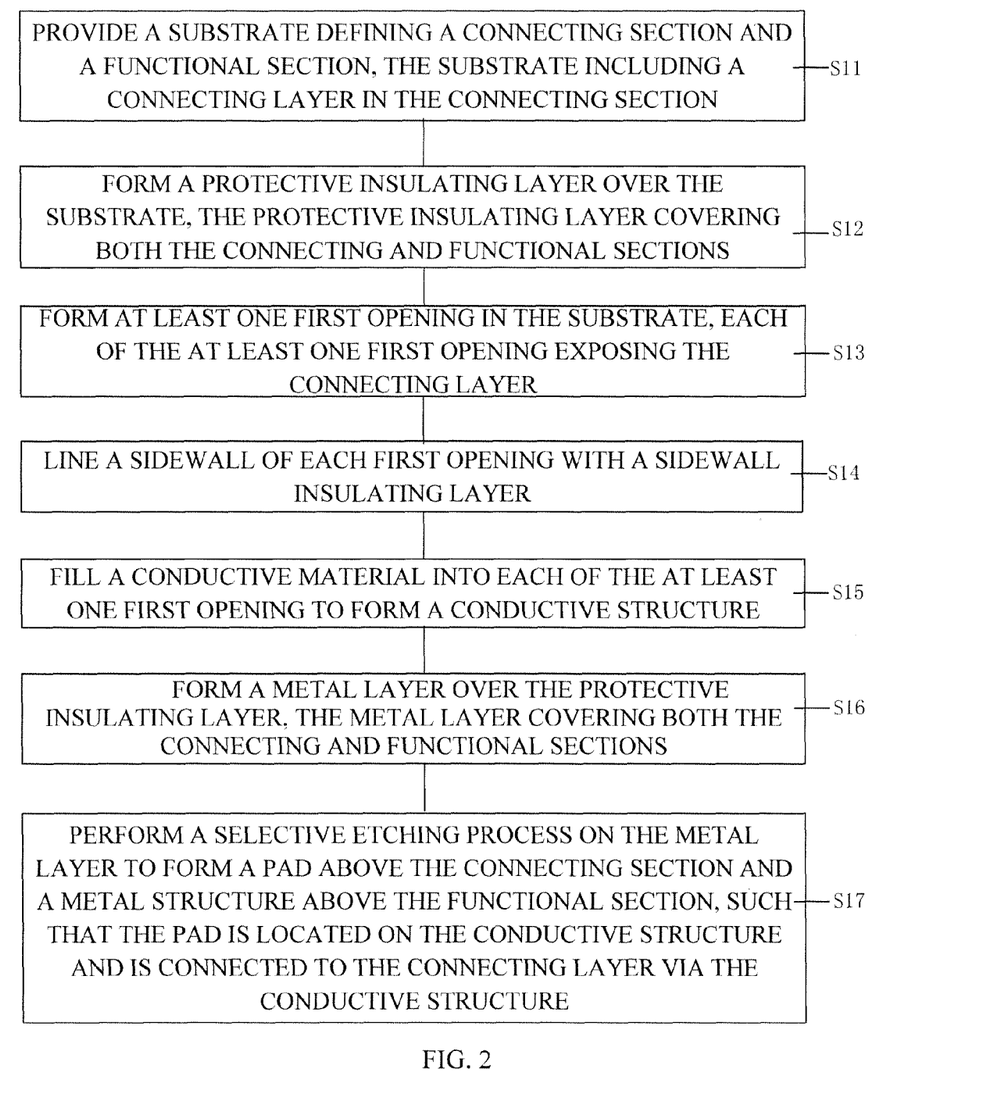
FIG. 2 depicts a flowchart graphically illustrating a method of fabricating a semiconductor structure in accordance with one embodiment of the present invention.

A method of fabricating the semiconductor structure will be described in detail below with reference to FIGS. 2 to 14, in which, FIG. 2 is a flowchart showing the progression of the method and FIGS. 3 to 14 are schematics depicting the process steps of the method.

Figure 3:
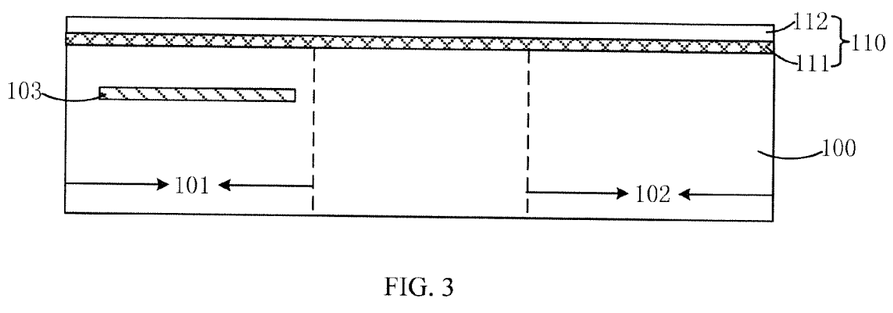
FIGS. 3-14 are schematics showing a method of fabricating a semiconductor structure in accordance with one embodiment of the present invention.

In step S11, as shown in FIG. 3, the substrate 100 defining the connecting section 101 and the functional section 102 is provided, wherein the connecting layer 103 is situated in the connecting section 101. Generally, the connecting layer 103 is surrounded by a dielectric layer so as to be electrically insulated from other circuitry components.

Referring again to FIG. 3, in step S12, the protective insulating layer 110 is formed on the substrate 100.

Figure 4:
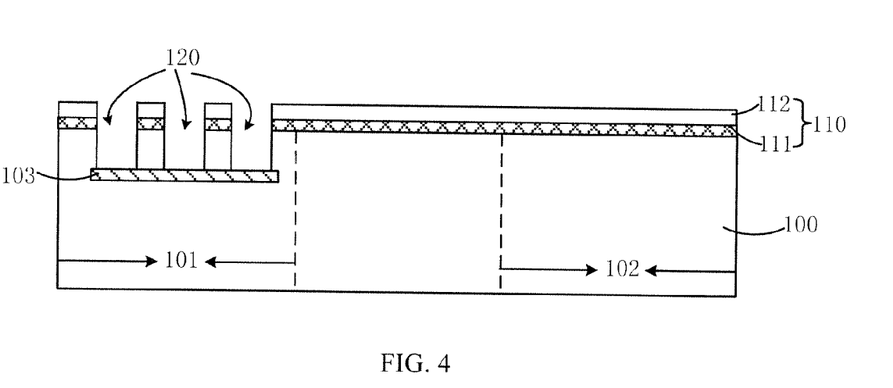

In step S13, as shown in FIG. 4, the at least one first opening 120 is formed in the substrate 100 by etching the protective insulating layer 110 and the substrate 100. In this step, each of the at least one first opening 120 may either have a depth to directly expose the connecting layer 103, or a depth to just expose the dielectric layer surrounding the connecting layer 103.

Figure 5:
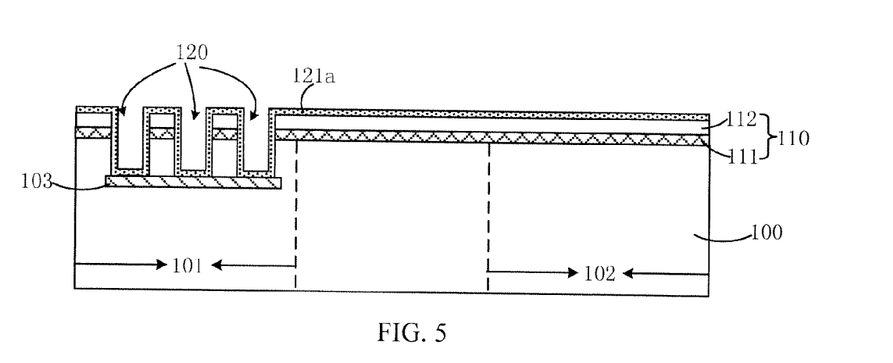
Figure 6:
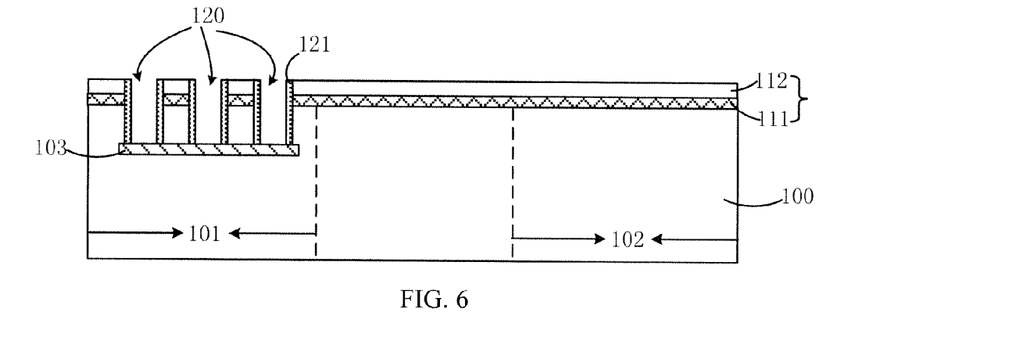

In step S14, a sidewall insulating layer 121 is formed to line the sidewall of each of the at least one first opening 120. Step S14 may further include the steps of:

S141) forming an insulating layer 121a over the substrate 100, the insulating layer 121a covering both the protective insulating layer 110 and each of the at least one first opening 120, as shown in FIG. 5; and S142) performing an etch-back process to the insulating layer 121a to expose surface of the protective insulating layer 110 and a bottom of each of the at least one first opening 120, such that the remainder of the insulating layer 121a lines the sidewalls of each of the at least one first opening 120 and a bottom of each of the at least one first opening 120 exposes the underlying connecting layer 103, as shown in FIG. 6.

Figure 7:
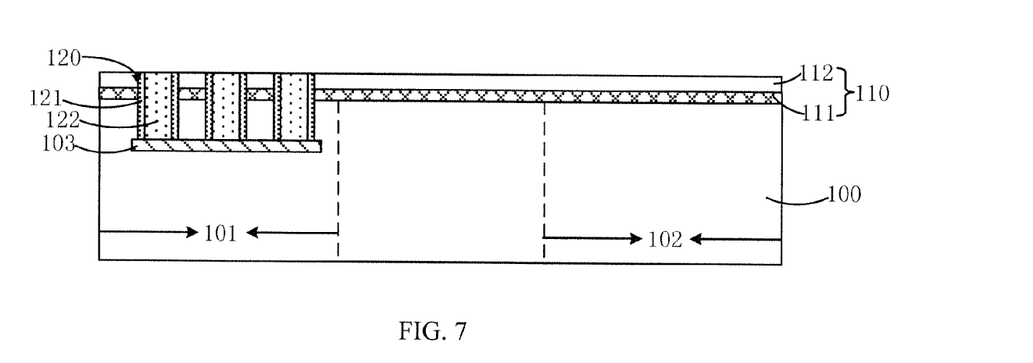

In step S15, as shown in FIG. 7, the conductive material is filled into each of the at least one first opening 120 to form the conductive structure 122.

Figure 8:
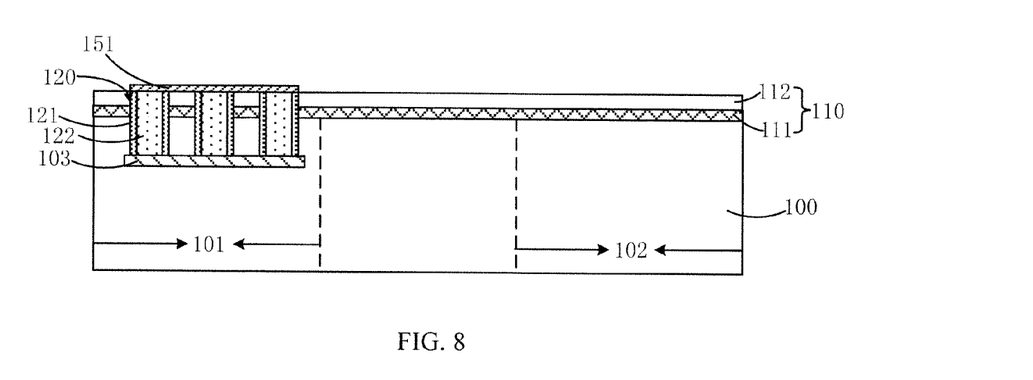

Referring now to FIG. 8, after step S15 and prior to the subsequent step S16, the first conductive layer 151 of the semiconductor structure 1 may be formed, covering the conductive structure 122.

Figure 9:
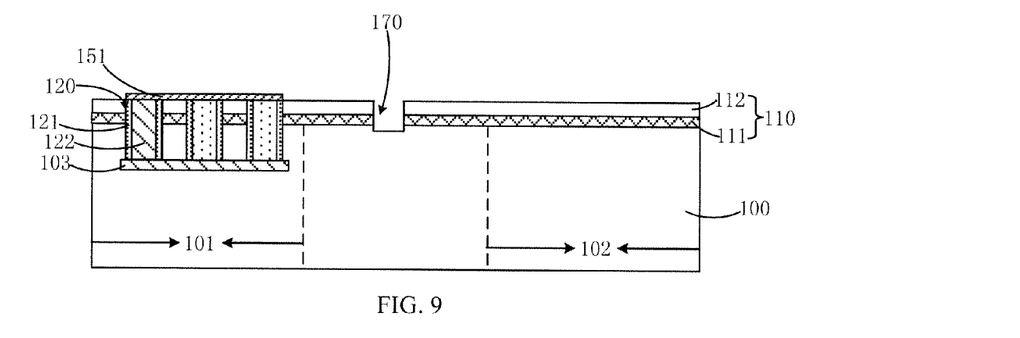

In addition, as shown in FIG. 9, the third opening 170 for accommodating the grounding structure 171 of the semiconductor structure 1 may also be formed in the protective insulating layer 110 after step S15 and prior to step S16 to expose a portion of the substrate 100.

Figure 10:
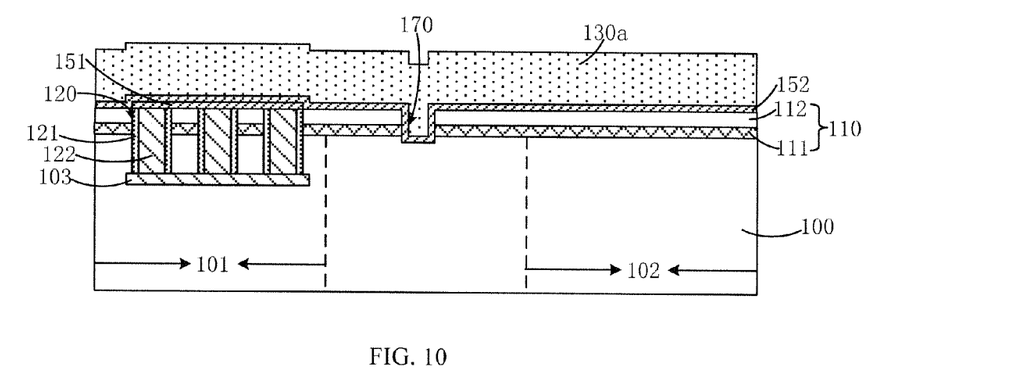

Further, as shown in FIG. 10, the second conductive layer 152 of the semiconductor structure 1 may also be formed between the protective insulating layer 110 and a metal layer 130a described blow after step S15 and prior to step S16.

Referring again to FIG. 10, in step S16, the metal layer 130a is formed over the protective insulating layer 110. The metal layer 130a may be fabricated from aluminum or another suitable metal, which has high conductivity and a good light-blocking property.

Figure 11:
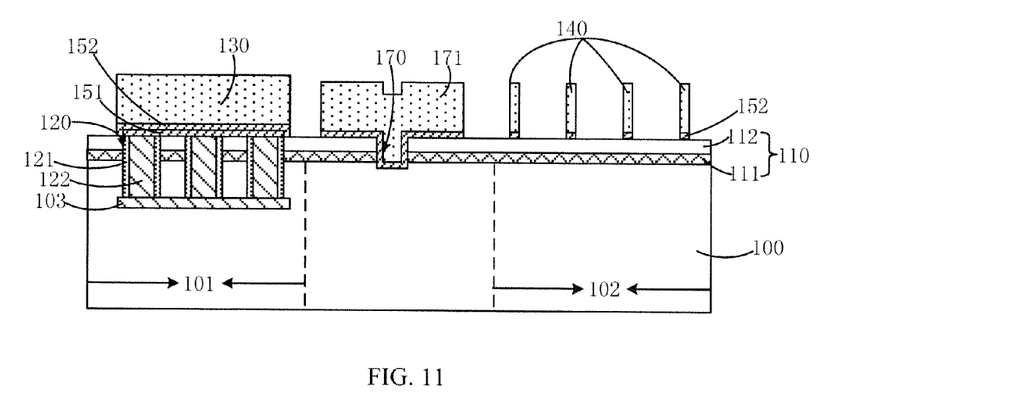

In step S17, as shown in FIG. 11, a selective etching process is performed on the metal layer 130a to form the pad 130 above the connecting section 101 and the metal structure 140 above the functional section 102. Concurrently, the grounding structure 171 may also be formed in this step on the substrate 100.

Figure 12:
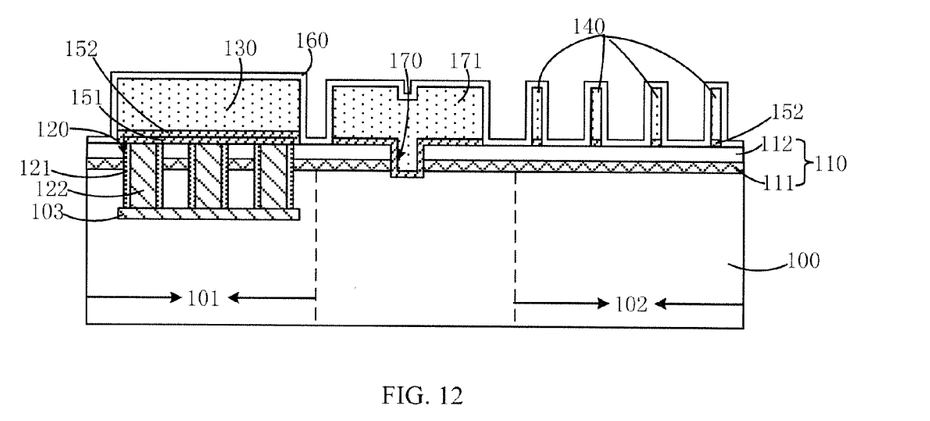

In this embodiment, the method preferably further includes forming a protective layer 160 over the substrate 100, covering each of the pad 130, the metal structure 140, and the grounding structure 171, as shown in FIG. 12.

Figure 13:
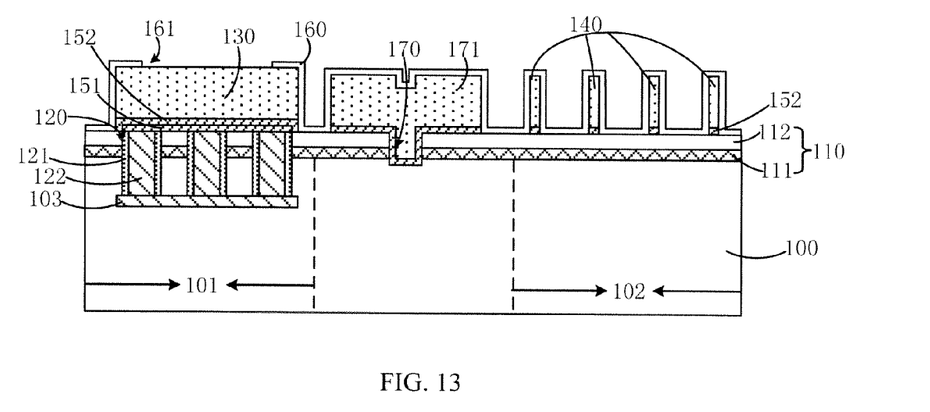
Figure 14:
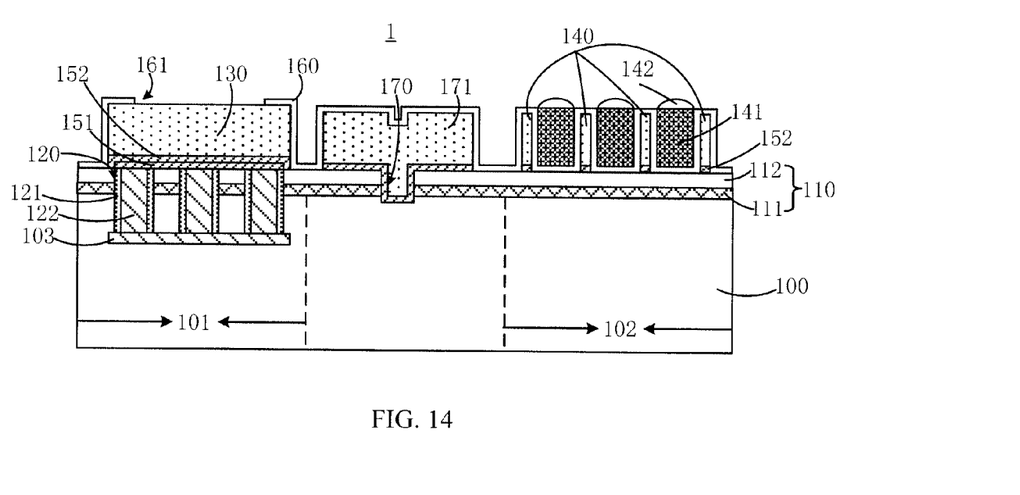

Further, as shown in FIG. 13, with the formation of the protective layer 160, the second opening may be formed therein to expose a portion of the top surface of the pad 130. Afterward, the optical filters 141 may be arranged between adjacent portions of the metal structure 140 and the lenses 142 may be arranged on corresponding optical filters 141, thereby resulting in the semiconductor structure 1 shown in FIG. 14.

In conclusion, as the pad 130 is connected to the connecting layer 103 by the conductive structure 122 and the pad 130 and the metal structure 140 are formed from the same metal layer 130a, the advantages of process simplification, throughput improvement and cost reduction can be achieved by simultaneously forming the pad 130 and the metal structure 140 through forming a single metal layer (i.e, the metal layer 130a) and performing thereon a single selective etching process (i.e., step S17). Moreover, the only element disposed between the metal structure 140 and the substrate 100 and between the optical filters 141 and the substrate 100 is the protective insulating layer 110. This enables the evacuation of a protective layer for the pad 130 from paths between the optical filters 141 and corresponding photodiodes, thereby enhancing light absorption efficiency of the CMOS sensor.

While the semiconductor structure 1 and the metal structures 140 are illustrated and described herein as a CMOS sensor and light-blocking layers for filters of the sensor, respectively, the present invention is not limited to this regard as the semiconductor structure and the method of the invention can be employed by any device incorporating the metal structure 140 and the pad 130, fabricated from the same material.

Therefore, it can be understood from the foregoing description that the semiconductor structure and the method of the present invention provides the following advantages over the conventional structures and methods.

Firstly, as the pad is connected to the connecting layer by the conductive structure and the pad and the metal structure are formed from the same metal layer, the advantages of process simplification, throughput improvement and cost reduction can be achieved by simultaneously fabricating the pad and the metal structure through forming a single metal layer and performing thereon a single selective etching process.

Secondly, the only element disposed between the metal structure and the substrate is the protective insulating layer, which is particular beneficial for applications where the metal structure is implemented as one or more light-blocking layers for optical filters disposed between the light-blocking layers, because this makes the protective insulating layer the only element disposed between the optical filters and the substrate and thus enables paths between the optical filters and corresponding photodiodes to be only intervened by the protective insulating layer but no protective layer for the pad, thereby enhancing light absorption efficiency of the CMOS sensor.

Obviously, those skilled in the art may make various modifications and alterations without departing from the spirit and scope of the invention. It is therefore intended that the invention be construed as including all such modifications and alterations insofar as they fall within the scope of the appended claims or equivalents thereof.

What is claimed is:

1. A method of fabricating a semiconductor structure, comprising:
   providing a substrate defining a connecting section and a functional section, wherein the substrate includes a connecting layer in the connecting section;
   forming a protective insulating layer over the substrate, the protecting insulating layer covering both the connecting and functional sections;
   etching the protective insulating layer and the substrate to form at least one first opening, each of the at least one first opening exposing the connecting layer;
   lining a sidewall of each of the at least one first opening with a sidewall insulating layer;
   filling a conductive material into each of the at least one first opening to form a conductive structure;
   forming a metal layer over the protective insulating layer, the metal layer covering both the connecting and functional sections; and
   performing a selective etching process on the metal layer to form a pad above the connecting section and a metal structure above the functional section, such that the pad is located on the conductive structure and is connected to the connecting layer via the conductive structure.

2. The method of claim 1, wherein the protective insulating layer comprises a high-k dielectric insulating layer and an oxide layer stacked on the high-k dielectric insulating layer.

3. The method of claim 2, wherein the high-k dielectric insulating layer has a thickness of 5 nm to 100 nm.

4. The method of claim 2, wherein the oxide layer has a thickness of 10 nm to 200 nm.

5. The method of claim 1, further comprising forming a first conductive layer over the protective insulating layer after forming the conductive structure and prior to forming the metal layer, the first conductive layer covering the conductive structure.

6. The method of claim 5, wherein the first conductive layer is formed of thallium nitride or titanium nitride.

7. The method of claim 5, wherein the first conductive layer has a thickness of 5 nm to 100 nm.

8. The method of claim 1, further comprising forming a second conductive layer over the protective insulating layer, after forming the conductive structure and prior to forming the metal layer.

9. The method of claim 8, wherein the second conductive layer is formed of thallium nitride or titanium nitride.

10. The method of claim 8, wherein the second conductive layer has a thickness of 5 nm to 50 nm.

11. The method of claim 1, further comprising forming a protective layer over the substrate, the protective layer covering both the pad and the metal structure.

12. The method of claim 11, wherein the protective layer is a silicon oxide layer.

13. The method of claim 11, further comprising forming a second opening in the protective layer, the second opening exposing at least a portion of a top surface of the pad.

14. The method of claim 1, wherein the method further comprises:
   forming a third opening in the protective insulating layer after forming the conductive structure and prior to forming the metal layer, the third opening exposing a portion of the substrate; and
   forming a grounding structure in the substrate during the selective etching process performed on the metal layer, the grounding structure having at least a portion situated in the third opening.

15. The method of claim 1, wherein the semiconductor structure is a complementary metal-oxide-semiconductor sensor and the metal structure includes at least one light-blocking layer of the complementary metal-oxide-semiconductor sensor.

* * * * *